United States Patent
Shinohara et al.

(10) Patent No.: US 12,416,677 B2
(45) Date of Patent: Sep. 16, 2025

(54) METHOD FOR DETERMINING BATTERY STATE AND BATTERY STATE DETERMINATION DEVICE

(71) Applicant: TOYOTA BATTERY CO., LTD., Kosai (JP)

(72) Inventors: Daisuke Shinohara, Toyohashi (JP); Daisuke Koba, Toyohashi (JP)

(73) Assignee: TOYOTA BATTERY CO., LTD., Kosai (JP)

( * ) Notice: Subject to any disclaimer, the term of this patent is extended or adjusted under 35 U.S.C. 154(b) by 529 days.

(21) Appl. No.: 17/561,588

(22) Filed: Dec. 23, 2021

(65) Prior Publication Data

US 2022/0214404 A1 Jul. 7, 2022

(30) Foreign Application Priority Data

Jan. 4, 2021 (JP) .................. 2021-000181

(51) Int. Cl.
*G01R 31/3842* (2019.01)
*G01R 31/36* (2020.01)
*G01R 31/388* (2019.01)

(52) U.S. Cl.
CPC ..... *G01R 31/3842* (2019.01); *G01R 31/3648* (2013.01); *G01R 31/388* (2019.01)

(58) Field of Classification Search
CPC ............ G01R 31/3842; G01R 31/3648; G01R 31/388
See application file for complete search history.

(56) References Cited

U.S. PATENT DOCUMENTS

| | | | | |
|---|---|---|---|---|
| 11,624,787 B2* | 4/2023 | Uchino | ................. | H01M 10/42 320/137 |
| 2006/0093894 A1* | 5/2006 | Scott | ..................... | H01M 10/44 429/231.1 |
| 2009/0148756 A1* | 6/2009 | Specht | .................. | H01M 4/382 429/94 |
| 2011/0316548 A1* | 12/2011 | Ghantous | ............ | H01M 50/569 324/427 |
| 2012/0200266 A1* | 8/2012 | Berkowitz | ............ | H01M 10/44 320/139 |
| 2016/0054389 A1* | 2/2016 | Koba | ..................... | G01R 31/52 324/426 |

(Continued)

FOREIGN PATENT DOCUMENTS

JP 2014-206441 A 10/2014

*Primary Examiner* — Manuel A Rivera Vargas
(74) *Attorney, Agent, or Firm* — Maschoff Brennan

(57) ABSTRACT

A method for determining a negative electrode capacity of a rechargeable battery is performed by a measurement device that includes a voltage detector that detects a voltage value of the rechargeable battery, a current detector that detects a current value of the rechargeable battery, and a state of charge detector that detects a state of charge of the rechargeable battery. The method includes calculating an absolute value of a voltage slope indicating a voltage change amount with respect to a discharge amount when the state of charge of the rechargeable battery is less than 40%, comparing the absolute value of the voltage slope with a preset lower limit, and determining that the negative electrode capacity of the rechargeable battery has decreased when the absolute value of the voltage slope is less than or equal to the lower limit.

1 Claim, 2 Drawing Sheets

(56) References Cited

U.S. PATENT DOCUMENTS

2016/0190658 A1\* 6/2016 Ishibashi ............... H02J 7/0048
　　　　　　　　　　　　　　　　　　　　　324/432
2017/0285109 A1\* 10/2017 Kawamura .......... G01R 31/392
2020/0328608 A1\* 10/2020 Song ...................... G01R 31/36

\* cited by examiner

METHOD FOR DETERMINING BATTERY STATE AND BATTERY STATE DETERMINATION DEVICE

BACKGROUND

1. Field

The following description relates to a method and device for determining a battery state and, more particularly, to a method and device for determining the capacity of the negative electrode of a rechargeable battery.

2. Description of Related Art

A rechargeable battery, in particular, a rechargeable battery of which the use history is unknown, can be tested for anomalies, such as deterioration, through a known method that detects the resistance value or voltage changes during charging and discharging to determine the occurrence of an anomaly.

An exemplary battery state determination device uses the graph of FIG. 5 showing the relationship of the discharge amount [Ah] and the voltage [V] to perform a determination. For example, the battery state determination device determines whether a micro-short-circuit has occurred in a battery module. The battery state determination device includes a voltage detection circuit that detects the voltage value of the battery module, a current detection circuit that detects the current value, and a controller that detects the state of charge of the battery module. The controller calculates a voltage slope that indicates the relationship of the voltage change amount and the discharge amount when the state of charge of the battery module is less than 40%, compares the voltage slope with a preset upper limit, and determines that the battery module is in a micro-short-circuit state when the voltage slope is greater than the upper limit. If a battery module includes a micro-short-circuit, for example, the voltage would decrease more rapidly in a final discharge stage, in which the state of charge (SOC) is 10%, than the rate at which the voltage decreases in FIG. 5 (for example, refer to FIG. 3 in Japanese Laid-Open Patent Publication No. 2014-206441). Accordingly, the controller detects a micro-short-circuit state from the voltage slope at the time point at which SOC is 10%.

The exemplary battery state determination device described above evaluates the state of a battery without conducting a destructive test on the battery. This allows a rechargeable battery to be used again when the rechargeable battery is determined as being normal.

The negative electrode capacity is greater than the positive electrode capacity, for example, in a nickel-metal hydride rechargeable battery for a hybrid electric vehicle. Thus, the battery capacity of a nickel-metal hydride rechargeable battery for a hybrid electric vehicle is regulated at the positive electrode capacity. The invention described in Japanese Laid-Open Patent Publication No. 2014-206441 evaluates the quality of a rechargeable battery based on the determination of a micro-short-circuit state at the positive electrode.

However, even if the micro-short-circuit state of the positive electrode is satisfactory, the rechargeable battery may undergo further deterioration due to a decrease in the negative electrode capacity. In this case, the exemplary battery state determination device described above cannot determine the quality of the rechargeable battery.

Further, when the negative electrode capacity is greater than the positive electrode capacity, a decrease in the negative electrode capacity cannot be detected even through a capacity check test, which fully charges and discharges the battery.

Consequently, the only way to directly measure the negative electrode capacity is to destruct the rechargeable battery. In this case, the rechargeable battery will no longer be usable. Accordingly, the quality of a rechargeable battery cannot be determined through a non-destructive test.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for determining a negative electrode capacity of a rechargeable battery is provided. The method is performed by a measurement device that includes a voltage detector that detects a voltage value of the rechargeable battery, a current detector that detects a current value of the rechargeable battery, and a state of charge detector that detects a state of charge of the rechargeable battery. The method includes calculating an absolute value of a voltage slope indicating a voltage change amount with respect to a discharge amount when the state of charge of the rechargeable battery is less than 40%, comparing the absolute value of the voltage slope with a preset lower limit, and determining that the negative electrode capacity of the rechargeable battery has decreased when the absolute value of the voltage slope is less than or equal to the lower limit.

In another general aspect, a battery state determination device that determines a negative electrode capacity of a rechargeable battery is provided. The device includes a voltage detector that detects a voltage value of the rechargeable battery, a current detector that detects a current value of the rechargeable battery, a state of charge detector that detects a state of charge of the rechargeable battery, and a determination unit. The determination unit is configured to calculate an absolute value of a voltage slope indicating a voltage change amount with respect to a discharge amount when the state of charge of the rechargeable battery is less than 40%, compare the absolute value of the voltage slope with a preset lower limit, and determine that the negative electrode capacity of the rechargeable battery has decreased when the absolute value of the voltage slope is less than or equal to the lower limit.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

In this specification, "at least one of A and B" should be understood to mean "only A, only B, or both A and B."

SUMMARY OF EMBODIMENT

A battery state determination device of the present disclosure will now be described in accordance with an embodiment. A battery state determination device 10 and a battery state determination method performed by the device are for determining whether an alkaline rechargeable battery such as a nickel-metal hydride rechargeable battery is in a state in which a micro-short-circuit has occurred (micro-short-circuit state) and determining whether the negative electrode capacity has decreased.

A micro-short-circuit occurs when microscopic foreign matter enters or deposits in a battery. This may not immediately render the battery may unusable. However, the flow of micro-current through such a short-circuited location will instantaneously burn out that location. This will lower the performance of the battery or cause internal short-circuiting.

In the present embodiment, the battery state determination device 10 detects a decrease in the negative electrode capacity in addition to a micro-short-circuit. For example, in a nickel-metal hydride (NiMH) rechargeable battery for a hybrid electric vehicle, the negative electrode capacity is set to be greater than the positive electrode capacity. Accordingly, in a NiMH battery for a hybrid electric vehicle, the positive electrode capacity is regulated. That is, the battery capacity is determined by the positive electrode capacity. Thus, when the negative electrode capacity is greater than the positive electrode capacity, a decrease in the negative electrode capacity cannot be detected through a capacity check test, which fully charges and discharges the battery. In this respect, the battery state determination device 10 of the present embodiment allows a decrease in the negative electrode capacity to be detected through a non-destructive test to properly determine the battery state.

Battery State Determination Device 10

Figure 1:
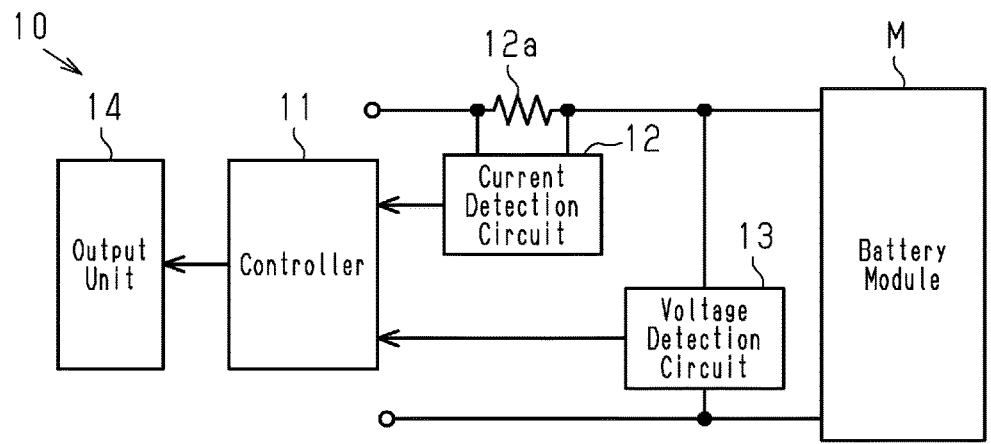
FIG. 1 is a block diagram showing the configuration of a battery state determination device in accordance with the present embodiment.

FIG. 1 is a block diagram showing the configuration of the battery state determination device 10 in accordance with the present embodiment. As shown in FIG. 1, the battery state determination device 10 includes a controller 11, a current detection circuit 12, and a voltage detection circuit 13. The current detection circuit 12 measures a value of the current flowing through a detection resistor 12a, which is connected in series to a battery module M, and provides the current value to the controller 11. The current detection circuit 12 corresponds to a current detector. The voltage detection circuit 13 measures the voltage between the two ends of the battery module M and provides the voltage value to the controller 11. The voltage detection circuit 13 corresponds to a voltage detector. The controller 11 transmits data indicating the current value provided from the current detection circuit 12 and voltage value provided from the voltage detection circuit 13 to an output unit 14. The output unit 14 accumulates the data received from the controller 11 and outputs the accumulated data.

Battery Module M

In the present embodiment, the battery module M is for a nickel-metal hydride (NiMH) rechargeable battery including six battery cells. The present embodiment describes an example of a newly manufactured battery module M for a vehicle. Alternatively, the battery state determination device 10 may be applied to a used battery or a stationary battery. A number of battery modules M are combined to form a battery stack. A battery pack (not shown) that is installed in a vehicle or the like includes a battery stack, an electronic control unit (ECU), and the like. In the present embodiment, the battery module M is connected to a charger via the controller 11 when the state of charge (SOC) is 0% (uncharged state). When the SOC of the battery module M of the present embodiment is 0%, the cell voltage is approximately 6V.

Controller 11

The controller 11 includes a central processing unit (CPU), a random-access memory (RAM), a read-only memory (ROM), and the like and provides the output unit 14 with a determination result. The output unit 14 is a personal computer (PC) including a display, a printer, and the like. Further, the controller 11 accumulates the current values provided by the current detection circuit 12 to calculate the SOC of the battery module M. The controller 11 corresponds to a state of charge detector. When the SOC of the battery module M reaches a predetermined value that is less than 40%, the controller 11 disconnects the battery module M from the charger to stop charging. In the present embodiment, the predetermined value of the SOC is set to 10%. Here, the battery module M is charged to 10% to shorten the measurement time. The battery module M may be fully charged but the measurement will take time.

In a state in which the battery module M is disconnected from the charger, the controller 11 calculates the discharge amount based on the current value provided by the current detection circuit 12. In this case, the controller 11 stores the discharge amount in storage (not shown) in correspondence with the voltage value provided by the voltage detection circuit 13. The controller 11 determines the discharge amount [Ah] and the voltage change amount [V] from when the SOC becomes equal to the predetermined value that is less than 40% (SOC 10% in the present example) to when the SOC becomes 0%, that is, when the SOC becomes a discharge end voltage (6 V in the present example). Further, the controller 11 calculates a voltage slope G that indicates the voltage change amount [V] with respect to the discharge amount [Ah]. The calculated voltage slope G is a negative value that forms a declining slope.

Operation of Battery State Determination Device 10

Figure 2:
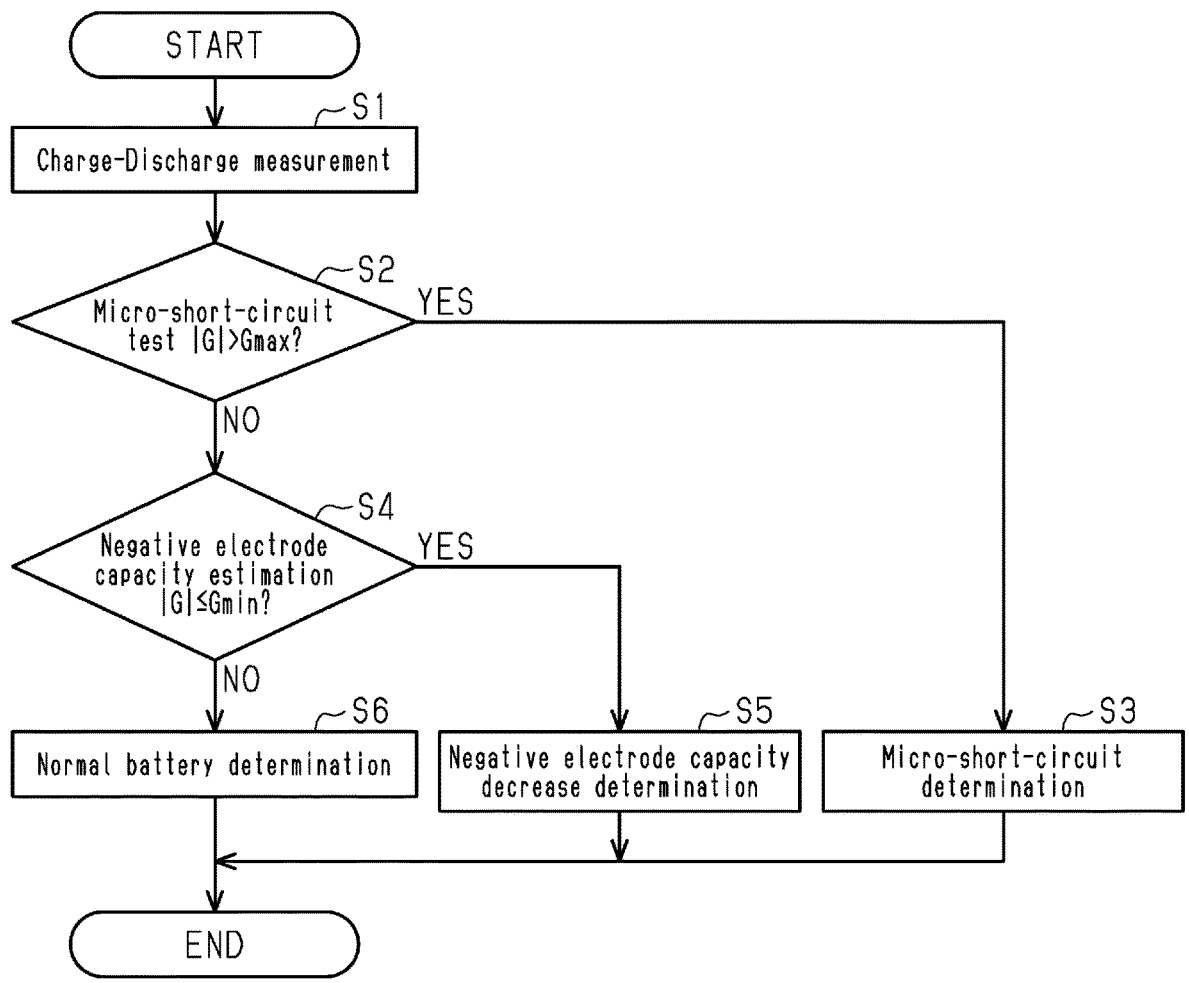
FIG. 2 is a flowchart illustrating a battery state determination process performed by the battery state determination device.

FIG. 2 is a flowchart illustrating a of a battery state determination process performed by the battery state determination device 10. When the battery state determination device 10 starts the determination, the battery state determination device 10 first performs a charge-discharge measurement (S1). Then, the battery state determination device 10 uses the result of the charge-discharge measurement to perform a micro-short-circuit test (S2). In the micro-short-circuit test, the battery state determination device 10 determines whether a first voltage decrease (voltage slope G) is greater than a first threshold value (upper limit Gmax). When the first voltage decrease is greater than the first threshold value (S2: YES), the battery state determination device 10 determines that there is a micro-short-circuit (S3) and that the battery module M is defective. When the first voltage decrease is less than or equal to the first threshold value (S2: NO), the battery state determination device 10 determines that there is no micro-short-circuit and proceeds to a negative electrode capacity estimation (S3). In the negative electrode capacity estimation (S3), the battery state determination device 10 determines whether a second voltage decrease (voltage slope G) is less than or equal to a second threshold value (lower limit Gmin). When the second voltage decrease is less than or equal to the second threshold value(S4: YES), the battery state determination device 10 determines that the negative electrode capacity has decreased (S5) and that the battery module M is defective. When the second voltage decrease is greater than the second threshold value (S4: NO), the battery state determination device 10 determines that the negative electrode capacity is sufficient. Thus, the battery state determination device 10 determines that the battery module M is normal (S6) and then ends the process. After the battery state determination process, the battery module M undergoes the next manufacturing process.

Each step of the process will now be described.

Charge-Discharge Measurement (S1)

The charge-discharge measurement will now be described with reference to FIG. 1. The battery module M that is subject to the determination is connected to the battery state determination device 10. For example, the connected battery module M underwent an aging process and is prior to initial charging. Accordingly, the SOC of the battery module M at this stage is 0%.

Further, the battery module M is connected to a charger via the controller 11 and charged to a predetermined value that is less than 40% (SOC of 10% in the present embodiment). In this case, the controller 11 accumulates the current values provided by the current detection circuit 12 to calculate the SOC. When the integrated value of the SOC reaches 10%, the controller 11 turns off a switch or the like that connects the battery module M and the charger to disconnect the battery module M from the charger.

When the supply of current from the charger to the battery module M is stopped, the battery module M discharges and the battery voltage decreases. The discharge current in the present embodiment is, for example, a constant current value of 2.0 A.

The controller 11 calculates the SOC of the battery module M based on the output value of the current detection circuit 12 and calculates the discharge amount until the SOC becomes 0%. Further, the controller 11 calculates the voltage of the battery module M based on the output value of the voltage detection circuit 13 and sequentially stores the voltage [V] in correspondence with the discharge amount [Ah].

Micro-Short-Circuit Test (S2)

When the SOC reaches 0%, the controller 11 calculates the absolute value of the voltage slope G [V/Ah], which indicates the voltage change amount with respect to the discharge amount, based on the voltage change amount [V] and the discharge amount [Ah] from when the SOC becomes 10% to when the SOC becomes 0%. Since the calculated voltage slope G [V/Ah] is a negative value that forms a declining slope, the absolute value of the voltage slope is used for comparison to facilitate understanding. When there is a micro-short-circuit in the positive electrode, the SOC will differ between cells in the final stage of discharge. The cell including a short-circuit will have a lower SOC than the other cells, and thus the voltage will decrease more quickly in the positive electrode of the cell having the short-circuit while a constant current is being discharged compared to when there is no micro-short-circuit in the positive electrode. In this manner, it can be determined that a micro-short-circuit is occurring in the positive electrode when the absolute value of the calculate voltage slope G [V/Ah] is relatively large.

The calculated absolute value of the voltage slope G [V/Ah] increases as the self-discharge amount of the battery module M increases due to a micro-short-circuit. Accordingly, the controller 11 stores the absolute value of the voltage slope G [V/Ah] at a preset deterioration limit of the battery module M as an upper limit Gmax.

The controller 11 reads the upper limit Gmax from the storage and compares the calculated absolute value of the voltage slope G [V/Ah] with the upper limit Gmax.

The controller 11 may change the SOC [%] at which the controller 11 starts the measurement based on a characteristic of the battery module M. Further, the controller may start the measurement based on the cell voltage [V] instead of the SOC. The number of coordinates (Ah, V) used for measurement, sampling intervals, and the upper limit Gmax may be appropriately selected.

In the present embodiment, the controller 11 gives a determination based on the voltage slope G [V/Ah] when the SOC is 10%. Alternatively, the controller 11 may calculate the voltage slope G [V/Ah] from, for example, two values respectively obtained when the SOC is 10% and when the SOC is 0%. Further, the controller 11 may calculate the voltage slope G [V/Ah] from three or more values. When the controller 11 calculates the voltage slope G [V/Ah] from three or more values, the controller 11 plots the measured coordinates (V, Ah) on the graph and obtains a regression line through a least-square method. The slope of the regression line is calculated to obtain the voltage slope G [V/Ah]. By obtaining the voltage slope G [V/Ah] from a plurality of points, the effect of noise or the like can be minimized. This allows for an accurate calculation and is thus desirable. For example, a micro-short-circuit state is detected from the voltage slope G of the battery module M when the SOC is less than 40% or the voltage slope G of the battery module M when the SOC is less than 10%. When the SOC is between 0% and 40%, the absolute value of the voltage slope G of the battery module M having a micro-short-circuit is greater than the absolute value of the voltage slope of a non-defective battery module M. Also, the absolute value of the voltage slope G when the SOC is 10% to 40% is less than the absolute value of the voltage slope G when the SOC is 0% to 10%.

Absolute Value of Voltage Slope G [V/Ah] Greater than Upper Limit Gmax (S2: YES)

Experiments are conducted to define the upper limit Gmax of the absolute value of the voltage slope G [V/Ah] for determination of whether there is a micro-short-circuit. The controller 11 stores the upper limit Gmax. The controller 11 compares the absolute value of the voltage slope G [V/Ah] with the upper limit Gmax. When the absolute value of the voltage slope G [V/Ah] is greater than the upper limit Gmax, the controller 11 determines that there is a micro-short-circuit.

Battery Module M Determined as Defective (S3)

When determining that there is a micro-short-circuit in the micro-short-circuit test (S2), the controller 11 determines that the battery module M is defective and that the life of the battery module M will be shorter than the set battery life. The battery module M that is determined as defective will not be used in a subsequent process such as manufacturing of a NiMH battery pack.

Absolute Value of Voltage Slope G [V/Ah] Less than or Equal to Upper Limit Gmax (S2: NO)

When the absolute value of the voltage slope G [V/Ah] is less than or equal to the upper limit Gmax, the controller 11 determines that there is no micro-short-circuit and that the battery module is normal. Then, the controller 11 proceeds to a subsequent step.

Negative Electrode Capacity Estimation (S4)

When the controller 11 determines that battery module is normal in the micro-short-circuit test (S2: NO), the controller 11 proceeds to the negative electrode capacity estimation.

In the present embodiment, the battery module M formed by a NiMH battery has a property that maintains a constant cell voltage until discharging ends if the battery module M has not been deteriorated. However, if the battery capacity decreases, the cell voltage falls quickly even if the SOC is the same. Nonetheless, after an aging process and is prior to initial charging, there is no way to know in advance when the voltage will fall greatly. Accordingly, in the charge-discharge measurement (S1), the battery module M is charged until the SOC becomes equal to the predetermined value that is less than 40%, and then the battery module M is discharged at the constant current of 2.0 A until the SOC becomes 0% to sequentially store the discharge amount (or the battery capacity) [Ah] and the cell voltage [V] during the discharge.

Figure 3:
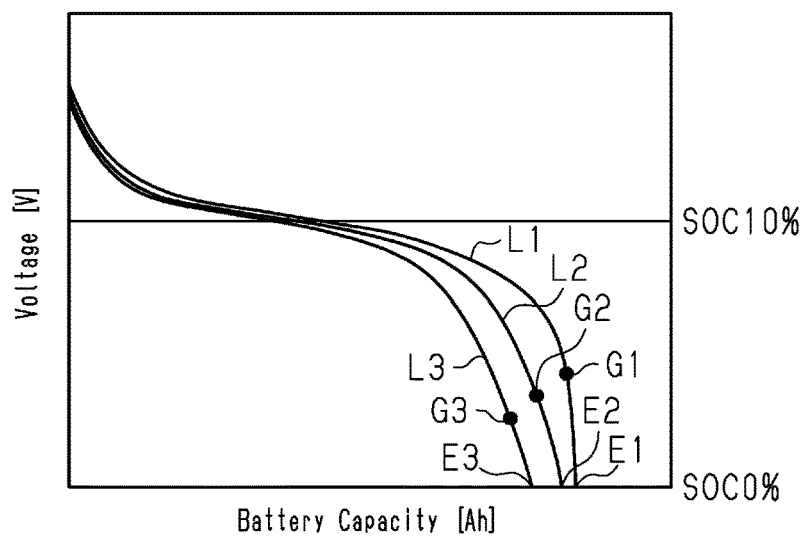
FIG. 3 is a graph indicating the relationship of the voltage and the battery capacity of a battery module.

The description will now be given with reference to FIG. 3. FIG. 3 shows a graph indicating the relationship of the battery capacity [Ah], the voltage [V], and the SOC[%] of battery modules having no micro-short-circuit. Graph L1 corresponds to a battery module M in which the negative electrode capacity has a low level of deterioration. Graph L2 corresponds to a battery module M in which the negative electrode capacity has an intermediate level of deterioration. Graph L3 corresponds to a battery module M in which the negative electrode capacity has a high level of deterioration. In an example, the controller 11 calculates the voltage slope G [V/Ah] indicating the voltage change amount [V] with respect to the discharge amount [Ah] when the SOC is approximately 0%, for example, when the SOC is in a range of 0% to approximately 40%, 0% to approximately 10% or 0% to approximately 4%. In another example, the controller 11 calculates the voltage slope G [V/Ah] indicating the voltage change amount [V] with respect to the discharge amount [Ah] for a section of a range in which the SOC is 0% to approximately 40%, 0% to approximately 10% or 0% to approximately 4%. The range of the SOC for calculating the voltage slope G [V/Ah] is not limited and may be set in accordance with a characteristic of the battery module M. In graph L1, point E1 indicates when the cell voltage of the battery module M having a low level of deterioration becomes 6V, that is, when the SOC becomes 0% in the present example. For example, the controller 11 plots coordinates (Ah, V) in 5.0-second intervals at thirty points going back in time from when the cell voltage reached point E1. In an example, the plotted thirty coordinates (Ah, V) correspond to the coordinates (AH, V) when the SOC is 0% to approximately 4%. Then, the controller 11 obtains the regression line through the least-square method based on the plotted thirty coordinates (Ah, V) on the graph. The slope of the line is calculated to obtain the voltage slope G [V/Ah], for example, the voltage slope G [V/Ah] between points E1 and G1. When the voltage slope G [V/Ah] is obtained from a plurality of points, the effect of noise or the like is minimized. This allows for an accurate calculation and is thus desirable. The voltage slopes G [V/Ah], for example, the voltage slopes G [V/Ah] between points E2 and G2 and the voltage slope G [V/Ah] between points E3 and G3, are calculated in graph L2 and graph L3 in the same manner.

When the calculated absolute values of the voltage slope G [V/Ah] in graphs L1 to L3 are compared, the absolute values of the voltage slope G [V/Ah] in graphs L1 to L3 satisfy the relationship of L1>L2>L3. As shown in the graph, the absolute value of the voltage slope G [V/Ah] decreases as the level of deterioration on the negative electrode capacity increases in the battery module M.

Figure 4:
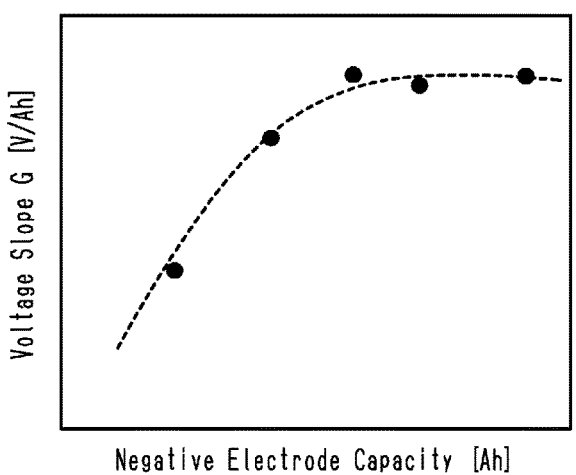
FIG. 4 is a graph indicating the relationship of voltage slope G [V/Ah] with respect to negative electrode capacity [Ah].
Figure 5:
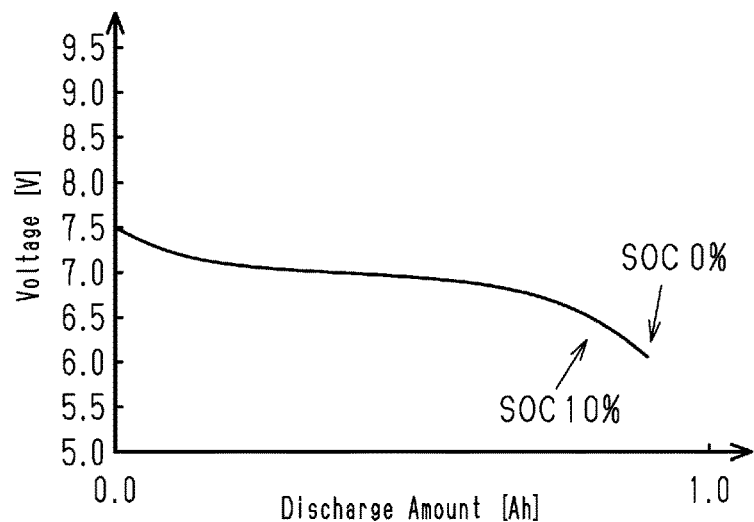
FIG. 5 is a graph indicating the relationship of discharge amount [Ah] and voltage [V] obtained through determinations performed by a battery state determination device disclosed in Japanese Laid-Open Patent Publication No. 2014-206441.

FIG. 4 is a graph indicating the relationship of voltage slope G [V/Ah] with respect to the negative electrode capacity [Ah]. The graph is obtained based on the plots measured in experiments. As shown in the graph, the negative electrode capacity [Ah] can be estimated from the measurement of the voltage slope G [V/Ah].

In the present embodiment, a lower limit Gmin is defined in accordance with the negative electrode capacity [Ah] that is required by an in-vehicle battery module M. At the lower limit Gmin, the absolute value of the voltage slope G [V/Ah] is the threshold value for the state determination of the battery module M. The controller 11 stores the absolute value of the voltage slope G [V/Ah] at the deterioration limit of the battery module M, which is preset as described above, in the storage as the lower limit Gmin. In the present embodiment, for example, the lower limit Gmin is 3.0 [V/Ah]. The controller 11 reads the lower limit Gmin from the storage and compares the calculated absolute value of the voltage slope G [V/Ah] and the lower limit Gmin.

The number of coordinates (Ah, V) used for measurement, sampling intervals, and the lower limit Gmin are set in accordance with a characteristic of the battery module M.

Absolute Value of Voltage Slope G [V/Ah] Less than or Equal to Lower Limit Gmin (S4: YES)

Experiments are conducted to define the lower limit Gmin of the absolute value of the voltage slope G [V/Ah] for determination of whether the negative electrode capacity has decreased. For example, in the present embodiment, the lower limit Gmin is set to 3.0 [V/Ah]. The controller 11 stores the lower limit Gmin. The controller 11 compares the absolute value of the voltage slope G [V/Ah] with the lower limit Gmin. When the absolute value of the voltage slope G [V/Ah] is less than or equal to the lower limit Gmin, the controller 11 determines that the negative electrode capacity has decreased.

Battery Module M Determined as Defective (S5)

When the controller 11 determines that the negative electrode capacity has decreased in the negative electrode capacity estimation (S4), the controller 11 determines that the battery module M is defective and that the life of the battery module M will be shorter than its set battery life. The battery module M that is determined as defective will not be used in a subsequent process such as manufacturing of a NiMH battery pack.

Absolute Value of Voltage Slope G [V/Ah] Greater than Lower Limit Gmin (S4: NO)

When the absolute value of the voltage slope G [V/Ah] is greater than the lower limit Gmin, the controller 11 determines that the negative electrode capacity has not decreased and that the battery module M is normal. Then, the controller 11 proceeds to the next step.

Battery Module M Determined as Normal (S6)

The controller 11 ends the process of the battery state determination when determining that the battery module M is normal in both of the micro-short-circuit test (S2) and the negative electrode capacity estimation (S4). The battery module M proceeds to a subsequent manufacturing process.

Advantage of Battery State Determination Device 10

The above described embodiment has the following advantages.

(1) The negative electrode capacity can be estimated without conducting a destructive test on the battery module M. This allows for elimination of a battery module M that has an insufficient negative electrode capacity.

(2) The battery state can be evaluated for not only a newly manufactured battery module M but also for a used battery module M.

(3) In particular, the battery state is determined from the detection of a micro-short-circuit and the detection of a decrease in the negative electrode capacity. This improves the product reliability.

(4) In particular, the battery state of the negative electrode is accurately determined for a positive electrode capacity regulated battery even if the battery is a stationary battery with an unknown use history in which case the battery may have been used at a high SOC or a low SOC under severe conditions.

(5) The described and illustrated example is a battery module M of a nickel-metal hydride rechargeable battery. Alternatively, a nickel-cadmium rechargeable battery or a lithium-ion battery may be used.

(6) The battery state is determined in a final stage of discharging. Thus, the battery does not have to be fully charged. This shortens the measurement time.

(7) The battery state is determined by basically measuring the cell voltage and the cell current. This allows the battery state determination device 10 to have a simple mechanical structure and saves costs.

Other Examples

The embodiment is only an example, and the numerical conditions such as the cell voltage, the positive electrode capacity, the SOC, and the cell current may be appropriately selected by those skilled in the art depending on the characteristics resulting from differences in the battery configuration.

In the present embodiment, an example of a battery module M for an in-vehicle nickel-metal hydride rechargeable battery is described. However, there is no limitation on the application and the battery state of a stationary battery, not to mention the battery state of a battery for a ship and an aircraft, may be determined.

The battery module M is described with an example of a nickel-metal hydride rechargeable battery. However, the battery type may be changed as long as the same discharge characteristics are shared and the same battery state determination method is implemented.

The above-described embodiment and its modified examples may be changed as long as there is no technical contradiction.

The above-described embodiment is an example of the present invention, and a person skilled in the art can add, delete, or modify the configuration without departing from the scope of claims.

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

What is claimed is:

1. A method for determining a negative electrode capacity of a rechargeable battery in real time during a capacity check test of the rechargeable battery, wherein the method is performed by a measurement device including a voltage detection circuit that detects a voltage value of the rechargeable battery, a current detection circuit that detects a current value of the rechargeable battery, a processor that receives the current value of the rechargeable battery from the current detection circuit and estimates a state of charge of the rechargeable battery based on the current value of the rechargeable battery, a nonvolatile memory that stores a preset lower limit of a voltage slope indicating a voltage change amount with respect to a discharge amount, and a display configured to output an image, the method comprising:

receiving, by the processor, voltage values and current values of the rechargeable battery from the voltage detection circuit and the current detection circuit during discharging of the rechargeable battery, and storing the voltage values and the current values in the nonvolatile memory;

calculating, by the processor, an absolute value of the voltage slope based on voltage values and current values of the rechargeable battery, which are detected when a state of charge of the rechargeable battery is in a predetermined range that is less than 40% and which are stored in the nonvolatile memory;

reading, by the processor, the preset lower limit of the voltage slope from the nonvolatile memory;

comparing, by the processor, the absolute value of the voltage slope with the preset lower limit;

determining, by the processor, that the negative electrode capacity of the rechargeable battery has decreased when the absolute value of the voltage slope is less than or equal to the lower limit;

outputting, by the processor, a result of the determination on the display;

charging the rechargeable battery until its state of charge reaches a predetermined value that is less than 40%, the predetermined value being an upper limit of the predetermined range; and in response to the state of charge reaching the predetermined value, disconnecting the rechargeable battery from a charger to stop charging the rechargeable battery.

\* \* \* \* \*